(12) United States Patent
Ueno et al.

(10) Patent No.: US 7,986,212 B2
(45) Date of Patent: Jul. 26, 2011

(54) FUSE

(75) Inventors: Masahiro Ueno, Shizuoka-ken (JP);
Katsuyuki Iwasaki, Shizuoka-ken (JP);
Teppei Doi, Shizuoka-ken (JP);
Hiromichi Hanaoka, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 140 days.

(21) Appl. No.: 12/101,188

(22) Filed: Apr. 11, 2008

(65) Prior Publication Data
US 2008/0284557 A1 Nov. 20, 2008

(30) Foreign Application Priority Data

May 15, 2007 (JP) ................................ P2007-128961
Sep. 6, 2007 (JP) ................................ P2007-231744

(51) Int. Cl.
*H01H 85/04* (2006.01)
*H01H 85/10* (2006.01)
*H01L 23/52* (2006.01)
*H01L 23/48* (2006.01)

(52) U.S. Cl. ........ 337/290; 257/529; 257/690; 337/158; 337/159; 337/295

(58) Field of Classification Search .............. 337/251, 337/158–159, 290, 295; 257/529, 690
See application file for complete search history.

(56) References Cited

U.S. PATENT DOCUMENTS

| 3,699,395 | A | * | 10/1972 | Boleky ........................ 361/805 |
| 3,778,886 | A | * | 12/1973 | Shields et al. ............... 438/132 |
| 4,780,698 | A | * | 10/1988 | Tomkinson et al. ......... 337/113 |
| 5,050,043 | A | * | 9/1991 | Schnabel ...................... 361/534 |
| 5,558,074 | A | * | 9/1996 | Fukatsu et al. ............... 123/647 |
| 5,642,253 | A | * | 6/1997 | Shreve ......................... 361/152 |
| 5,682,057 | A | * | 10/1997 | Kuriyama .................... 257/529 |
| 5,760,464 | A | * | 6/1998 | Suyama et al. .............. 257/665 |

(Continued)

FOREIGN PATENT DOCUMENTS

DE 197 54 415 A1 6/1999

(Continued)

OTHER PUBLICATIONS

Translation of the Official Action of the German Patent and Trademark Office, dated Aug. 21, 2009 (4 pages).

(Continued)

*Primary Examiner* — Jayprakash N Gandhi
*Assistant Examiner* — Bradley H Thomas
(74) *Attorney, Agent, or Firm* — Finnegan, Henderson, Farabow, Garrett & Dunner, L.L.P.

(57) ABSTRACT

A fuse includes: a first connecting terminal to be connected to a power source; a second connecting terminal to be connected to a load; a third connecting terminal to be connected to a relay control circuit; a fuse element having one end to be connected to the first connecting terminal; and a semiconductor relay directly mounted on the second connecting terminal. The semiconductor relay is a relay circuit switching between conducting and non-conducting states of a connection between its own drain and source electrodes, according to control signals inputted to the own gate electrode. The drain, source and gate electrodes are electrically connected to the other end of the fuse element, the second connecting terminal and the third connecting terminal, respectively. The first to third connecting terminals, the fuse element and the semiconductor relay are formed in an integral structure with a mold resin sealing portion.

4 Claims, 6 Drawing Sheets

U.S. PATENT DOCUMENTS

| | | | |
|---|---|---|---|
| 5,781,047 A * | 7/1998 | Shreve et al. | 327/110 |
| 6,100,728 A * | 8/2000 | Shreve et al. | 327/110 |
| 6,257,215 B1 * | 7/2001 | Kaminaga et al. | 123/647 |
| 6,365,433 B1 * | 4/2002 | Hyoudo et al. | 438/106 |
| 6,378,514 B1 * | 4/2002 | Kaminaga et al. | 123/633 |
| 6,504,467 B1 * | 1/2003 | Berberich et al. | 337/139 |
| 6,507,264 B1 * | 1/2003 | Whitney | 337/159 |
| 6,510,032 B1 * | 1/2003 | Whitney | 361/111 |
| 6,539,929 B2 * | 4/2003 | Ito et al. | 123/630 |
| 6,610,923 B1 * | 8/2003 | Nagashima et al. | 174/537 |
| 6,636,404 B1 * | 10/2003 | Whitney et al. | 361/111 |
| 6,735,065 B2 * | 5/2004 | Graf et al. | 361/103 |
| 6,753,204 B1 * | 6/2004 | Mayer | 438/107 |
| 6,982,859 B1 * | 1/2006 | Whitney | 361/111 |
| 7,148,504 B2 * | 12/2006 | Yamada | 257/48 |
| 2003/0142449 A1 * | 7/2003 | Iwata et al. | 361/58 |
| 2005/0224909 A1 * | 10/2005 | Yamaguchi et al. | 257/528 |
| 2005/0269674 A1 * | 12/2005 | Kawakita et al. | 257/666 |
| 2006/0268645 A1 * | 11/2006 | Graf et al. | 365/225.7 |

FOREIGN PATENT DOCUMENTS

| | | |
|---|---|---|
| DE | 198 52 115 A1 | 5/2000 |
| JP | 5-234495 | 9/1993 |
| JP | 07142672 A * | 6/1995 |
| JP | 2002-359349 | 12/2002 |

OTHER PUBLICATIONS

German Office Action dated Aug. 21, 2009.

* cited by examiner

FUSE

BACKGROUND OF THE INVENTION

1. Field of the Invention

The present invention relates to a fuse used in a circuit controlling power supply to a load through a relay circuit.

2. Description of the Related Art

An electrical junction box mounted in an automobile or an in-vehicle electric control unit has a function of distributing battery power to a predetermined load. As shown in FIG. 1, an electrical junction box 100 of a related art includes a fuse 102, a semiconductor relay 103 and a relay control circuit (unillustrated). The fuse 102 receives an input of an electric current from the battery 101, and prevents the electric current from being excessively supplied from the battery 101. The semiconductor relay 103 either allows or does not allow the electric current supplied through the fuse 102 to flow into a load 110. The relay control circuit controls the semiconductor relay 103. The semiconductor relay 103 is mounted on a board 104 housed in a package 100a. The relay control circuit is formed of an electronic component (unillustrated) mounted on the board 104 and of a circuit pattern (unillustrated) formed on the board 104. Japanese Patent Application Publication No. 2002-359349 discloses an example in which the semiconductor relay 103 is mounted on the board 104 in the package 100a.

In another related example, as shown in FIG. 2, a mechanical relay is used instead of the semiconductor relay 103 while being mounted on a board 104 as similar to the semiconductor relay 103. Here, the description of this related example will be provided by giving the same reference numerals as shown in FIG. 2 to the same components as described in the foregoing related example while excluding the redundant explanations of the same components.

A fuse 102 is a plug-in type fuse attached to a tuning fork terminal (unillustrated) provided to a package 100a of an electrical junction box 100. As shown in FIG. 3, the fuse 102 includes a first connecting terminal 102a, a second connecting terminal 102b arranged in parallel with the first connecting terminal 102a, and a fuse element 102c provided between these two terminals 102a and 102b. The fuse 102 has an integral structure formed by sealing, with a mold resin sealing portion 102d, the fuse element 102c and the first and second connecting terminals 102a and 102b excluding portions to be connected to corresponding terminals. The tuning fork terminal to which the fuse 102 is attached is provided outside the package 100a from the viewpoint of convenience in maintenance, check and the like.

In the related example, however, the semiconductor relay 103 and the mechanical relay 105, which are heat sources, are mounted on the board 104 inside the package 100a. Accordingly, spaces for installing the semiconductor relay 103 and the mechanical relay 105 need to be secured on the board 104 and the like. This is one of the factors of increasing the size of the board 104 and accordingly the size of the package 100a including the board 104 therein. Since the relay circuits are heat sources, the board 104 and the like need to be made of a high-heat-radiation material and a high-heat-resistant material. Use of such materials requires high costs for manufacturing the board 104. In addition, when the semiconductor relay 103 or the mechanical relay 105 breaks down, the board 104, as a whole, has to be exchanged. Hence, this configuration has poor maintainability.

SUMMARY OF THE INVENTION

The present invention has been made to solve the forgoing problems of the related art. An object of the present invention is to provide a fuse capable of preventing various problems which are considered to be attributable to a configuration in which a relay circuit is housed inside a package.

An aspect of the present invention is a fuse comprising: a first connecting terminal to be connected to a side of a power source; a second connecting terminal to be connected to a side of a load; a third connecting terminal to be connected to a side of a relay control circuit; a fuse element having one end connected to the first connecting terminal; a semiconductor relay including a relay circuit configured to switch between a conducting state and a non-conducting state of a connection between a drain electrode and a source electrode of the semiconductor relay according to a control signal inputted to a gate electrode of the semiconductor relay, the drain electrode being electrically connected to the other end of the fuse element, the source electrode being electrically connected to the second connecting terminal, and the gate electrode being electrically connected to the third connecting terminal, wherein the first, second and third connecting terminals, the fuse element and the semiconductor relay are formed in an integral structure.

According to the aspect of the present invention, the fuse includes the semiconductor relay therein. This configuration makes it unnecessary to mount the semiconductor relay on a board or the like, or to secure a space in which the semiconductor relay is installed. In order to provide a relay function to the electrode junction box, it suffices to attach the fuse to the outside of the electrical junction box or the like. This configuration allows a size reduction of the board included in the electrical junction box, accordingly the package of the electrical junction box and the like. The size reduction of the board and the package leads to a weight reduction and cost reduction.

Moreover, it is not necessary to mount the relay circuit, which is a heat source, on the board or the like inside the electrical junction box. Accordingly, the board or the like can be formed without use of a high-radiation material or a high-resistant material. This also leads to a cost reduction. In addition, when the semiconductor relay breaks down, the necessary repair work is to exchange only the fuse. Thus, the maintainability is improved.

The semiconductor relay may have one surface being formed as any one of the drain electrode, the source electrode and the gate electrode, and includes a semiconductor arranging electrode to be connected to the other end of the fuse electrode, and the semiconductor relay may be directly mounted on the semiconductor arranging electrode.

With the forgoing configuration, a process of connecting the semiconductor relay to one electrode can be completed only by mounting the semiconductor relay on the semiconductor arranging electrode. Thus, the processes for manufacturing the fuse can be simplified.

The semiconductor relay may have one surface being formed as any one of the drain electrode, the source electrode and the gate electrode, and the semiconductor relay may be directly mounted on the second connecting terminal.

According to the forgoing configuration, the second connecting terminal is used as a mounting surface on which the semiconductor relay is mounted. This eliminates the necessity of additionally manufacturing a semiconductor arranging electrode, and therefore contributes to the simplification of a fuse structure. Moreover, the processes for manufacturing the fuse can be simplified without needing a process of electrically connecting the semiconductor relay and the second connecting terminal to each other.

The first connecting terminal and the fuse element may be integrally formed.

According to the foregoing configuration, the fuse element is formed simultaneously during the manufacturing of the first connecting terminal. Thus, the processes for manufacturing the fuse can be simplified.

The first connecting terminal, the fuse element and the semiconductor arranging electrode may be integrally formed.

According to the foregoing configuration, the fuse element and the semiconductor arranging electrode are formed simultaneously during the manufacturing of the first connecting terminal. Thus, the processes for manufacturing the fuse can be simplified.

The fuse element may be made of a low melting metal and formed in a wire shape, and the wire-shaped fuse element may be interposed between the first connecting terminal and the drain electrode of the semiconductor relay by wire bonding.

According to the foregoing configuration, the fuse element is manufactured easily, which allows the fuse configuration to be simplified. Moreover, a fuse having desirable fuse properties can be manufactured since the melting point of the fuse element is easily adjustable.

The fuse may further comprise a semiconductor relay driving element configured to output a driving signal to the gate electrode of the semiconductor relay, wherein the semiconductor relay driving element is formed into a single unit together with the first, second and third connecting terminals, the fuse element and the semiconductor relay.

According to the foregoing configuration, both the semiconductor relay and the semiconductor relay driving element are included inside the fuse. This leads to a further weight reduction and cost reduction of the electrical junction box or the like.

The first, second and third connecting terminals, the semiconductor relay and the semiconductor relay driving element may be sealed with a mold resin sealing portion to form a single unit, the fuse element may be connected to fuse connecting portions exposed from the mold resin sealing portion, and the mold resign sealing portion and the fuse element may be housed in a case to form an integral unit as a whole.

According to the foregoing configuration, the semiconductor relay and the semiconductor relay driving element are completely separated from the outside by the mold resign sealing portion. This surely prevents water, dust or the like from adversely influencing the fuse. In contrast, the fuse element itself is not sealed with the mold resin sealing portion. Thus, the fuse element is surely blown out when receiving an excessive electric current

DESCRIPTION OF THE PREFERRED EMBODIMENT

Figure 1:
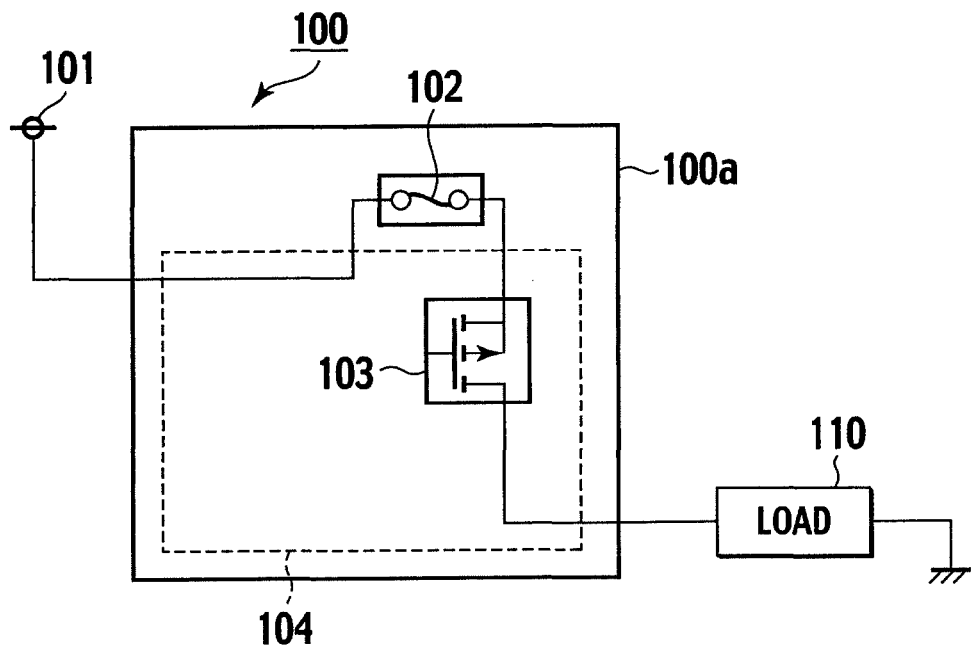
FIG. 1 is a conceptual diagram of circuits and the like of a related electrical junction box.
Figure 2:
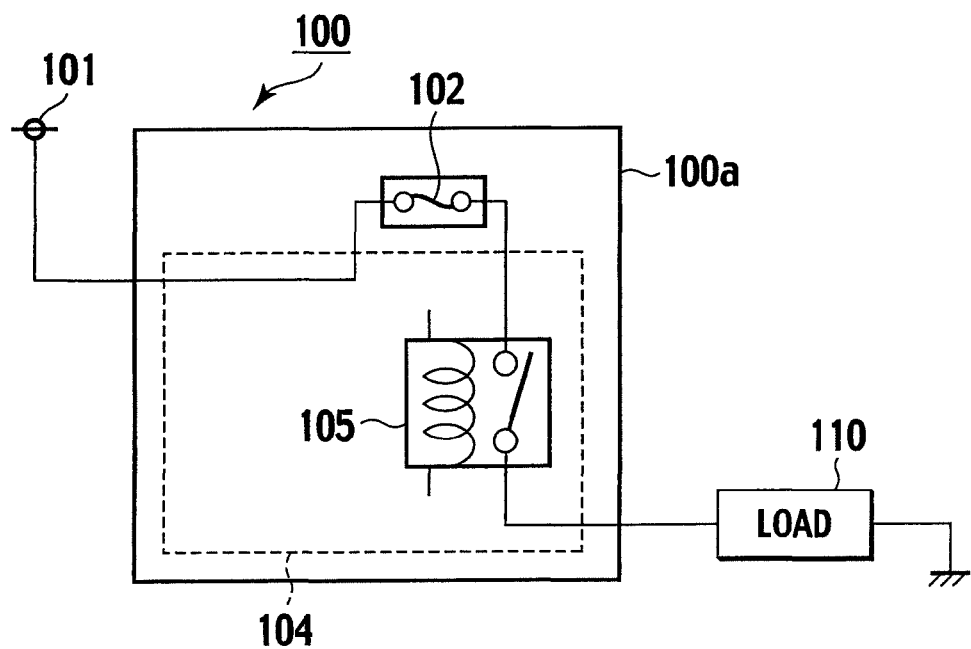
FIG. 2 is a conceptual diagram of circuits and the like of another related electrical junction box.
Figure 3:
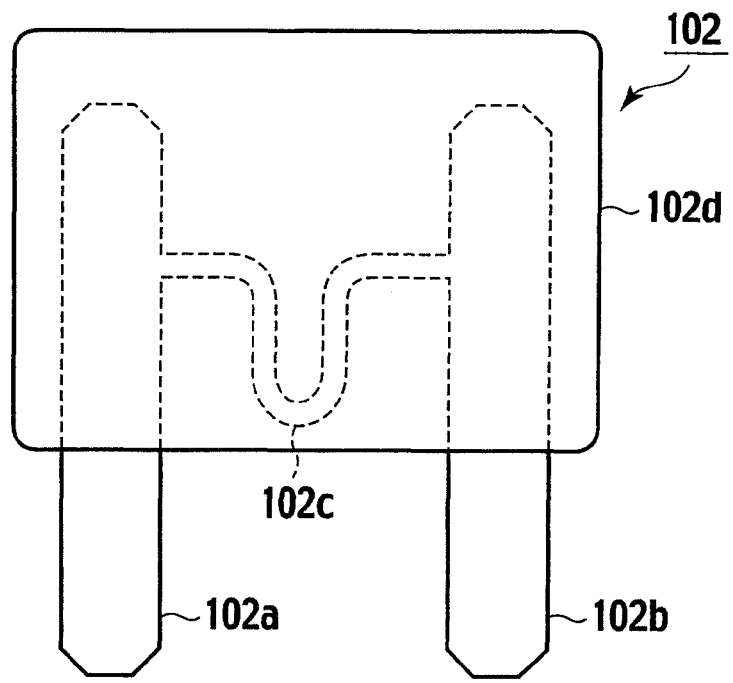
FIG. 3 is a front view of a related fuse.

Hereinafter, embodiments of the present invention will be described on the basis of the accompanying drawings. In the following description of the drawings, the same or similar components are provided with the same or similar reference numerals.

First Embodiment

Figure 4:
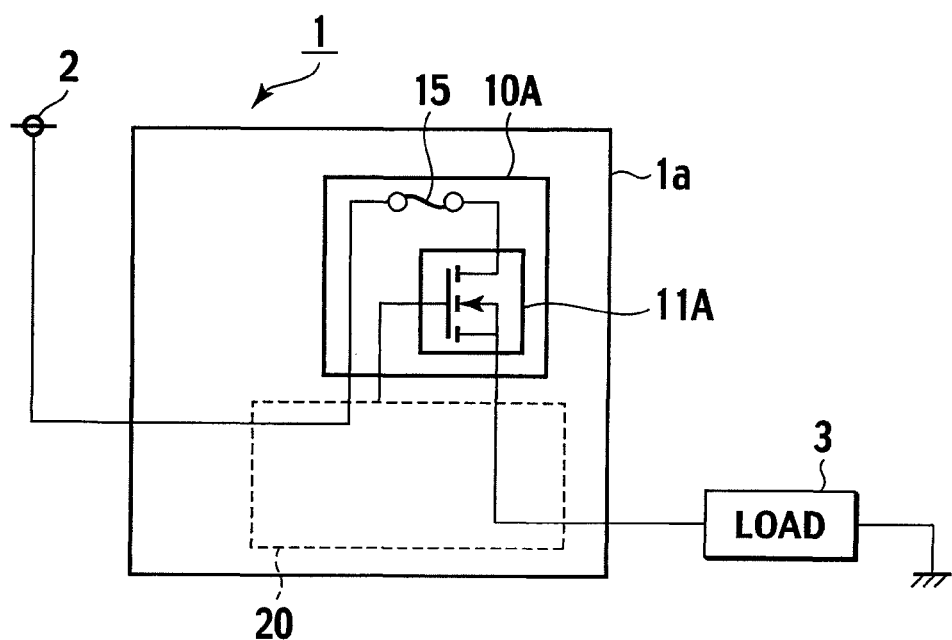
FIG. 4 is a conceptual diagram of circuits and the like of an electrical junction box according to a first embodiment of the present invention.
Figure 5:
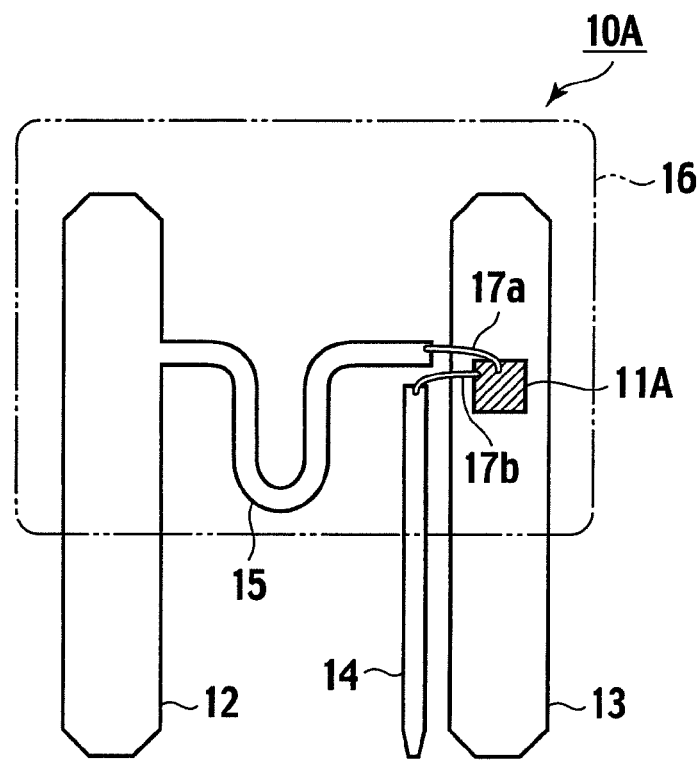
FIG. 5 is a front view of a fuse according to the first embodiment of the present invention.

FIGS. 4 and 5 show a first embodiment. FIG. 4 is a conceptual diagram of an electrical junction box or the like. FIG. 5 is a front view of a fuse.

As shown in FIG. 4, the electrical junction box 1 includes a fuse 10A, a semiconductor relay 11A and a relay control circuit (unillustrated). The fuse 10A receives an electric current from the battery 2 which is a power source, and prevents the electric current from being excessively supplied from the battery 2. The semiconductor relay 11A either allows or does not allow the electric current provided through the fuse 10A to flow into the load 3. The relay control circuit controls the semiconductor relay 11A.

The fuse 10A is a plug-in type, and is attached to a tuning fork terminal (unillustrated) arranged outside a package 1a. The semiconductor relay 11A is incorporated in the fuse 10A, and a detailed configuration of the fuse 10A is described below. The relay control circuit (unillustrated) is formed of an electronic component (unillustrated) mounted on a board 20 inside a package 1a and of a circuit pattern (unillustrated) formed on the board 20.

Hereinafter, the detailed configuration of the fuse 10A will be described. As shown in FIG. 5, the fuse 10A includes: a first connecting terminal 12 to be connected to a side of the battery 2; a second connecting terminal 13 to be connected to a side of a load 3; a third connecting terminal 14 to be connected to a side of the relay control circuit; a fuse element 15; and the semiconductor relay 11A mounted on the second connecting terminal 13. The fuse 10A has an integral structure formed by sealing, with a mold resin sealing portion 16, the fuse element 15, the semiconductor relay 11A and the first to third connecting terminals 12, 13 and 14 excluding respective portions to be connected to corresponding terminals.

The first connecting terminal 12 and the fuse element 15 are formed into an integral structure in which the first connecting terminal 12 and one end of the fuse element 15 are connected to each other. The integral structure of the first connecting terminal 12 and the fuse element 15 is manufactured, for example, by pressing and cutting a base material for a busbar through processes.

The semiconductor relay 11A is a bare chip such as a FET, and includes a source electrode (unillustrated), a drain electrode (unillustrated) and a gate electrode (unillustrated). The source electrode is arranged on the back surface of the semiconductor relay 11A, while the drain electrode and the gate electrode are arranged on respective portions of the front surface thereof. Thus, a relay circuit is formed to switch between a conducting state and a non-conducting state of a connection between the drain electrode and the source electrode according to a control signal inputted to the gate electrode. The drain electrode is electrically connected to the other end of fuse element 15 through a bonding wire 17*a*. The source electrode is electrically connected to the second connecting terminal 13 by soldering the semiconductor relay 11A to the second connecting terminal 13. The gate electrode is electrically connected to the third connecting terminal 14 through a bonding wire 17*b*.

In the aforementioned structure, the semiconductor relay 11A is incorporated into the fuse 10A. Unlike the conventional fuse, the configuration of this embodiment does not need to be processed to mount the semiconductor relay 11A on the board 20 and to secure a space for installing the semiconductor relay 11A. With this configuration, the fuse 10A can be just attached to the electrical junction box 1 as an external component. This results in a size reduction of the board 20 included in the electrical junction box 1 and accordingly a size reduction of the package 1*a* of the electrical junction box 1 and the like. The size reduction of the package 1*a* makes the electrical junction box 1 more lightweight, and also leads to a cost reduction for manufacturing the electrical junction box 1. In addition, the relay circuit, which is a heat source, does not need to be mounted on the board 20 or the like inside the electrical junction box 1. This eliminates the necessity to use a high-heat-radiation material and a high-heat-resistant material to form the board 20 or the like, and thereby also leads to a cost reduction. Furthermore, when the semiconductor relay 11A breaks down, the necessary repair work is only to exchange the fuse 10A. Thus, the maintainability is improved.

In the first embodiment, the semiconductor relay 11A is formed to use its own back surface as the source electrode, and is directly mounted on the second connecting terminal 13. Accordingly, the configuration of the fuse can be simplified without needing a process of additionally manufacturing an electrode for arranging a semiconductor. In addition, this configuration does not need a process of electrically connecting the semiconductor relay 11A and the second connecting terminal 13 to each other, and accordingly makes it possible to simplify the processes for manufacturing the fuse 10A.

Since the first connecting terminal 12 and the fuse element 15 are integrally formed in the first embodiment, the processes for manufacturing the fuse 10A can be simplified.

Second Embodiment

Figure 6:
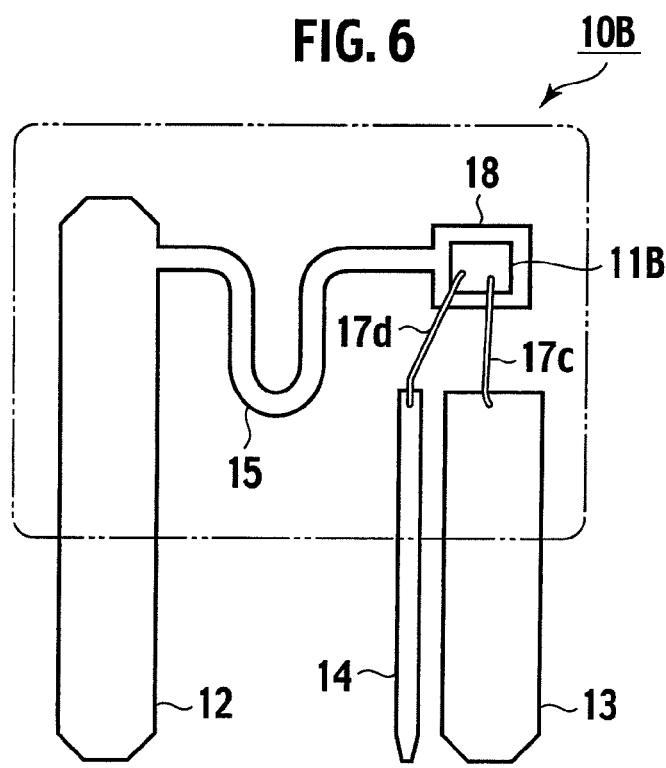
FIG. 6 is a front view of a fuse according to a second embodiment of the present invention.

FIG. 6 is a front view of a fuse according to a second embodiment of the present invention.

As shown in FIG. 6, a fuse 10B includes: a first connecting terminal 12 to be connected to a side of a battery 2; a second connecting terminal 13 to be connected to a side of a load 3; a third connecting terminal 14 to be connected to a side of a relay control circuit; a fuse element 15; a semiconductor arranging electrode 18; and a semiconductor relay 11B mounted on the semiconductor arranging electrode 18. The fuse 10B has an integral structure formed by sealing, with a mold resign sealing portion 16, the fuse element 15, the semiconductor arranging electrode 18, the semiconductor relay 11B and the first to third connecting terminals 12, 13 and 14 excluding respective portions to be connected to corresponding terminals.

The first connecting terminal 12, the fuse element 15 and the semiconductor arranging electrode 18 are formed into an integral structure in which the first connecting terminal 12 and one end of the fuse element 15 are connected to each other while the semiconductor arranging electrode 18 and the other end of the fuse element 15 are connected to each other. The integral structure of the first connecting terminal 12, the fuse element 15 and the semiconductor arranging electrode 18 is manufactured, for example, by pressing and cutting a base material for a busbar through processes.

The semiconductor relay 11B is a bare chip such as a FET, and includes a source electrode (unillustrated), a drain electrode (unillustrated) and a gate electrode (unillustrated). The drain electrode is arranged on the back surface of the semiconductor relay 11B, while the source electrode and the gate electrode are arranged on respective portions of the front surface thereof. Thus, a relay circuit is formed to switch between a conducting state and a non-conducting state of a connection between the drain electrode and the source electrode according to a control signal inputted to the gate electrode. The drain electrode is soldered to the semiconductor arranging electrode 18 and thereby is electrically connected to the other end of fuse element 15. The source electrode is electrically connected to the second connecting terminal 13 through a bonding wire 17*c*. The gate electrode is electrically connected to the third connecting terminal 14 through a bonding wire 17*d*.

As is the case with the first embodiment, the fuse 10B of the second embodiment also produces various effects attributable to a fact that the fuse 10B does not need a relay circuit to be mounted on the board.

In addition, the fuse 10B in the second embodiment has a configuration in which: the semiconductor relay 11B is formed to use its own back surface as the drain electrode; the semiconductor arranging electrode 18 is connected to the other end of the fuse element 15; and the semiconductor relay 11B is directly mounted on the semiconductor arranging electrode 18. This configuration allows a process of connecting the semiconductor relay 11B to one electrode to be completed only by mounting the semiconductor relay 11B on the semiconductor arranging electrode 18. Thus, the processes for manufacturing the fuse 10B can be simplified.

In the second embodiment, since the first connecting terminal 12, the fuse element 15 and the semiconductor arranging electrode 18 are integrally formed, the processes for manufacturing the fuse 10B can be simplified.

Third Embodiment

Figure 7:
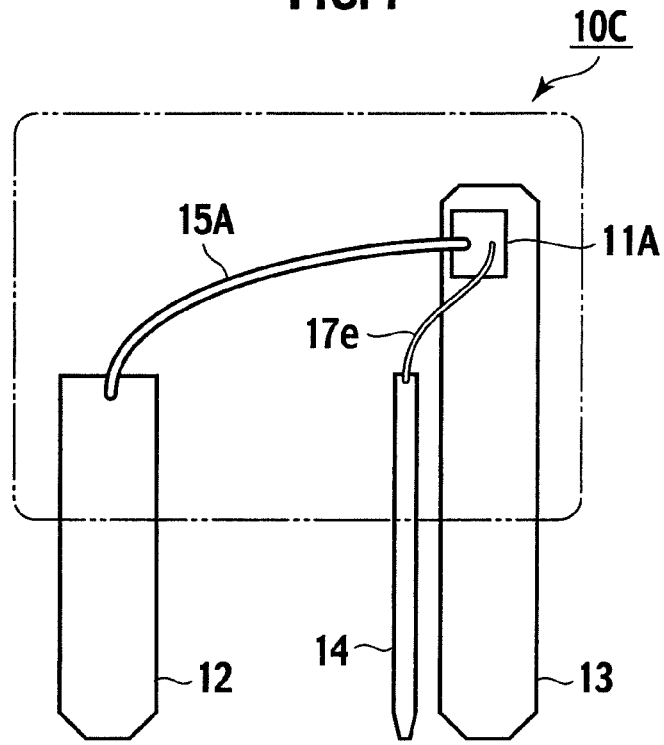
FIG. 7 is a front view of a fuse according to a third embodiment of the present invention.

FIG. 7 is a front view of a fuse according to a third embodiment of the present invention.

As shown in FIG. 7, a fuse 10C includes: a first connecting terminal 12 to be connected to a side of a battery 2; a second connecting terminal 13 to be connected to a side of a load 3; a third connecting terminal 14 to be connected to a side of a relay control circuit; a fuse element 15A; and a semiconductor relay 11A mounted on the second connecting terminal 13. The fuse 10C has an integral structure formed by sealing, with a mold resign sealing portion 16, the fuse element 15A, the semiconductor arranging electrode 18, the semiconductor relay 11A and the first to third connecting terminals 12, 13 and 14 excluding respective portions to be connected to corresponding terminals.

The fuse element 15A is made of a low melting metal (for example, a Zn alloy) and formed in a wire shape. By wire bonding, the wire-shaped fuse element 15A is interposed between the first connecting terminal 12 and a drain electrode (unillustrated) of the semiconductor relay 11A.

The semiconductor relay 11A is a bare chip such as a FET as similar to the first embodiment, and includes a source electrode (unillustrated), a drain electrode (unillustrated) and a gate electrode (unillustrated). The source electrode is arranged on the back surface of the semiconductor relay 11A, while the drain electrode and the gate electrode are arranged on respective portions of the front surface thereof. Thus, a relay circuit is formed to switch between a conducting state and a non-conducting state of a connection between the drain electrode and the source electrode according to a control signal inputted to the gate electrode. As described above, the drain electrode is electrically connected to the other end of the wired-shape fuse element 15A. The source electrode is electrically connected to the second connecting terminal 13 by soldering the semiconductor relay 11A to the second connecting terminal 13. The gate electrode is electrically connected to the third connecting terminal 14 through a bonding wire 17e.

As is the case with the first embodiment, the fuse 10C of the third embodiment also produces various effects attributable to a fact that the fuse 10C does not need a relay circuit to be mounted on the board 20.

In the third embodiment, the semiconductor relay 11A is formed to use its own back surface as the source electrode, and is directly mounted on the second connecting terminal 13. Accordingly, as is the case with the first embodiment, the configuration of the fuse can be simplified without needing a process of additionally manufacturing an electrode for arranging a semiconductor. In addition, this configuration does not need a process for electrically connecting the semiconductor relay 11A and the second connecting terminal 13 to each other, and accordingly makes it possible to simplify the processes for manufacturing the fuse 10C.

In the third embodiment, the fuse element 15A is made of a low melting metal and formed in a wire shape. By wire bonding, this wire-shaped fuse element 15A is interposed between the first connecting terminal 12 and a drain electrode of the semiconductor relay 11A. Thus, the configuration of the fuse can be simplified because the fuse element 15A can be manufactured easily. Moreover, since the melting point of the fuse element 15A can be adjusted easily, the fuse 10C having desired fuse characteristics can be easily manufactured.

Fourth Embodiment

Figure 8:
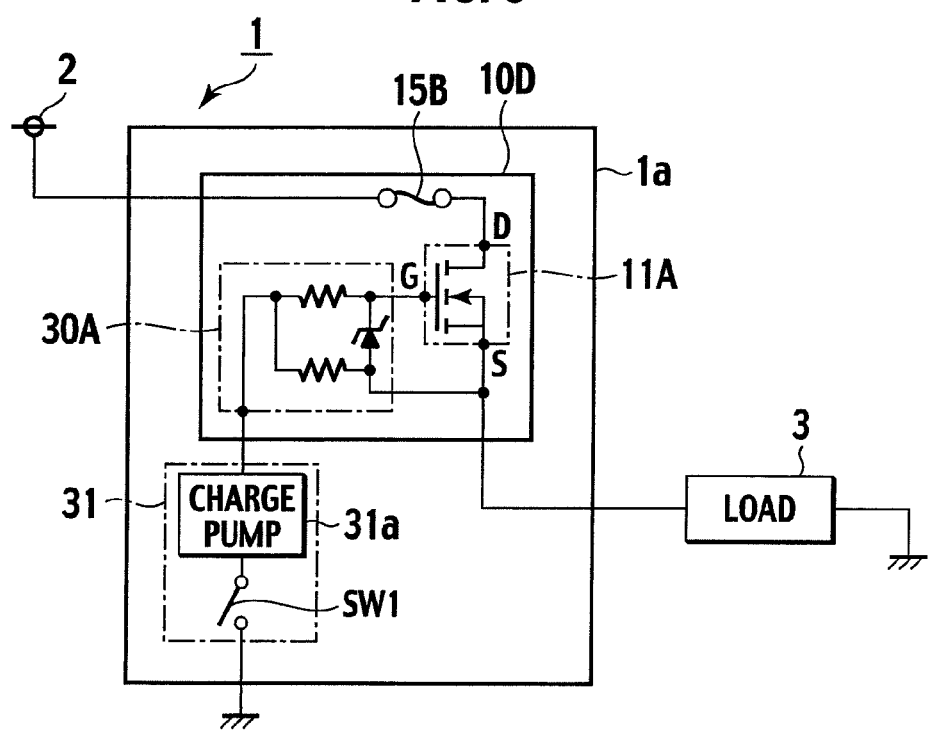
FIG. 8 is a conceptual diagram of circuits and the like of an electrical junction box according to a fourth embodiment of the present invention.
Figure 9:
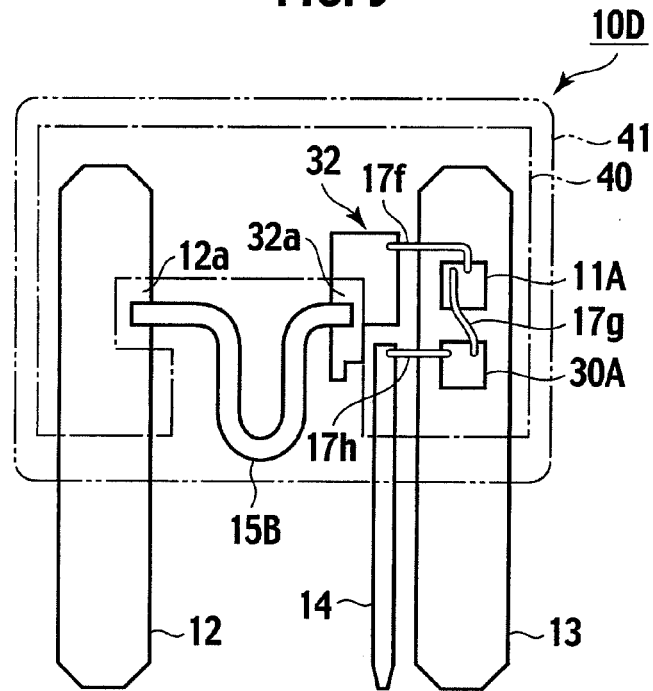
FIG. 9 is a front view of a fuse according to the fourth embodiment of the present invention.
Figure 10:
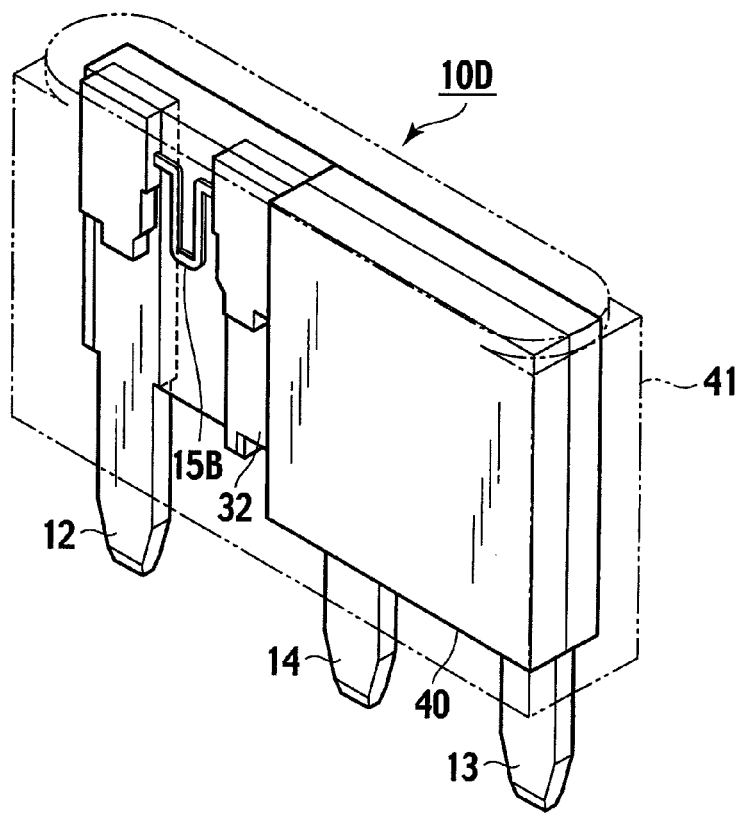
FIG. 10 is a perspective view of a fuse according to the fourth embodiment of the present invention.

FIGS. 8 to 10 show a fourth embodiment of the present invention. FIG. 8 is a conceptual diagram of circuits and the like of an electrical junction box, FIG. 9 is a front view of a fuse, and FIG. 10 is a perspective view of the fuse.

As shown in FIG. 8, an electrical junction box 1 includes a fuse 10D, a semiconductor relay 11A, a semiconductor relay driving element 30A and a relay control circuit 31. The fuse 10D receives an electric current from a battery 2 which is a power source, and prevents the electric current from being excessively supplied from the battery 2. The semiconductor relay 11A either allows or does not allow the electric current provided through the fuse 10D to flow into the load 3. The semiconductor relay driving element 30A drives the semiconductor relay 11A, and the relay control circuit 31 controls the semiconductor relay 11A.

The fuse 10D is a plug-in type, and is attached to a tuning fork terminal (unillustrated) arranged outside a package 1a. The semiconductor relay 11A and the semiconductor relay driving element 30A are incorporated in the fuse 10D, and a detailed configuration of the fuse 10D is described below. The relay control circuit 31 is composed of a charge pump circuit 31a and a control switch SW1. In the fourth embodiment, the charge pump 31a is needed since the semiconductor relay 11A is of an N-channel MOS type and operates as a high-side switch (drive).

Hereinafter, the detailed configuration of the fuse 10D will be described. As shown in FIG. 9, the fuse 10D includes: a first connecting terminal 12 to be connected to a side of the battery 2; a second connecting terminal 13 to be connected to a side of a load 3; a third connecting terminal 14 to be connected to a side of the relay control circuit 31; a fuse element 15B; the semiconductor relay 11A mounted on the second connecting terminal 13; the semiconductor relay driving element 30A also mounted on the second connecting terminal 13; and a relay terminal 32.

The connecting terminals 12, 13 and 14, the fuse element 15 and the relay terminal 32 are made of respective separate busbar materials.

The semiconductor relay 11A is a bare chip such as a FET of an N-channel MOS type, and includes a source electrode S (unillustrated), a drain electrode D (unillustrated) and a gate electrode G (unillustrated). The source electrode S is arranged on the back surface of the semiconductor relay 11A, while the drain electrode D and the gate electrode G are arranged on respective portions of the front surface thereof. Thus, a relay circuit is formed to switch between a conducting state and a non-conducting state of a connection between the drain electrode and the source electrode according to a control signal inputted to the gate electrode. The drain electrode is electrically connected to the relay terminal 32 through a bonding wire 17f. The source electrode is electrically connected to the second connecting terminal 13 by soldering the semiconductor relay 11A to the second connecting terminal 13. The gate electrode is electrically connected to an output electrode (unillustrated) of the semiconductor relay driving element 30A through a bonding wire 17g.

The semiconductor relay driving element 30A is a bare chip, and includes a source-side electrode (unillustrated), an input electrode (unillustrated) and an output electrode (unillustrated). The source-side electrode is arranged on the back surface of the semiconductor relay driving element 30A, while the input electrode and the output electrode are arranged on respective portions of the front surface thereof. The source-side electrode is electrically connected to the second connecting terminal 13 by soldering the semiconductor relay driving element 30A to the second connecting terminal 13. The input electrode is connected to the third connecting terminal 14 through a bonding wire 17h.

An integral structure is formed by sealing, with a mold resign sealing portion 16, the relay terminal 32, the semiconductor relay 11A, the semiconductor relay driving element 30A, and the first to third connecting terminals 12, 13 and 14 excluding respective portions to be connected to corresponding terminals. In addition, fuse connecting portions 12a and 32a of the first connecting terminal 12 and the relay terminal 32 are exposed to the outside without being sealed with the mold resin sealing portion 40.

By soldering or the like, both ends of the fuse element 15B are respectively connected to the two fuse connecting portions 12a and 13a exposed from the mold resin sealing portion 40. The mold resin sealing portion 40 and the fuse element 15B are housed in a case 41. Thereby, the fuse 10D is formed as an integral unit as a whole (see FIG. 10).

In the foregoing structure, the semiconductor relay 11A and the semiconductor relay driving element 30A are incorporated in the fuse 10D. Thus, the package 1a of the electrical junction box 1 or the like is further reduced in size in comparison with the first embodiment. Such size reduction of the board and the package 1a leads to further weight reduction of the electrical junction box 1 and manufacturing-cost reduction thereof. Since a relay circuit, which is a heat source, does not need to be mounted on the board inside the electrical junction box 1, the board and the like can be made without use of a high-heat radiation material or a high-heat resistant material. This also reduces the costs. In addition, when the semiconductor relay 11A breaks down, the necessary repair work is only to exchange the fuse 10D. Thus, the maintainability is improved.

In the fourth embodiment, the first to third connecting terminals 12, 13 and 14, the semiconductor relay 11A and the semiconductor relay driving element 30A are sealed with the mold resin sealing portion 40 to form the integral structure. Moreover, the fuse element 15B is connected to the fuse connecting portions 12a and 32a exposed from the mold resin sealing portion 40. Then, the mold resin sealing portion 40 and the fuse element 15B are housed in the case 41 to form a single unit as a whole. Accordingly, the semiconductor relay 11A and the semiconductor relay driving element 30A are completely separated from the outside by the mold resign sealing portion 40. This configuration surely prevents water, dust or the like from adversely influencing the fuse 10D. In contrast, the fuse element 15B itself is not sealed with the mold resin sealing portion 40. Thus, the fuse element 15B is surely blown out when receiving an excessive electric current.

Fifth Embodiment

Figure 11:
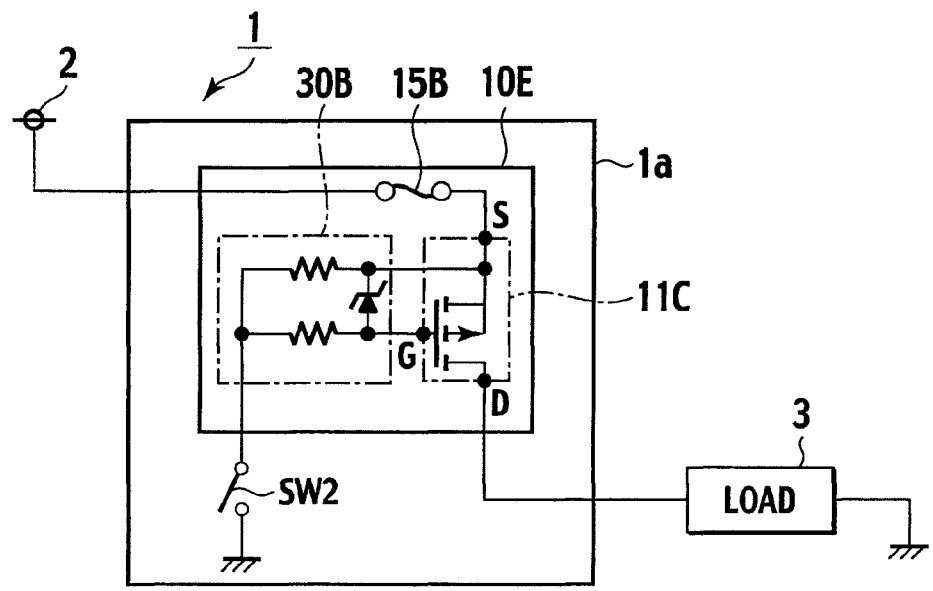
FIG. 11 is a conceptual diagram of circuits and the like of an electrical junction box according to a fifth embodiment of the present invention.
Figure 12:
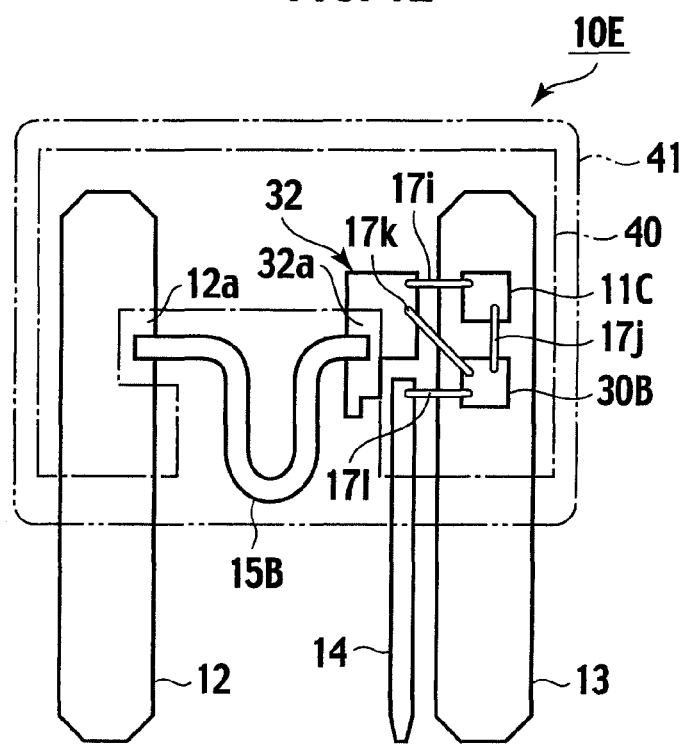
FIG. 12 is a front view of a fuse according to the fifth embodiment of the present invention.

FIGS. 11 and 12 show a fifth embodiment of the present invention. FIG. 11 is a conceptual diagram of circuits and the like in an electrical junction box, and FIG. 12 is a front view of a fuse.

As shown in FIG. 11, an electrical junction box 1 includes a fuse 10E, a semiconductor relay 11C, a semiconductor relay driving element 30B and a control switch SW2 as similar to the fourth embodiment. The fuse 10E prevents an excessive electric current from being supplied from a battery 2. The semiconductor relay 11C either allows or does not allow the electric current provided through the fuse 10E to flow into a load 3. The semiconductor relay driving element 30B drives the semiconductor relay 11C. The control switch SW2 is a relay control circuit configured to control the semiconductor relay 11C through the semiconductor relay driving element 30B.

The fuse 10E is a plug-in type, and is attached to a tuning fork terminal (unillustrated) arranged outside a package 1a. The semiconductor relay 11C and the semiconductor relay driving element 30B are incorporated in the fuse 10E, and a detailed configuration of the fuse 10E is described below. In this embodiment, the semiconductor relay 11C is a P-channel MOS type, and accordingly is controllable only by the control switch SW2.

Hereinafter, the detailed configuration of the fuse 10E will be described. As shown in FIG. 12, as is the case with the fourth embodiment, the fuse 10E includes: a first connecting terminal 12 to be connected to a side of a battery 2; a second connecting terminal 13 to be connected to a side of a load 3; a third connecting terminal 14 to be connected to a side of the control switch SW2; a fuse element 15B; the semiconductor relay 11C mounted on the second connecting terminal 13; and the semiconductor relay driving element 30B also mounted on the second connecting terminal 13; and a relay terminal 32.

The connecting terminals 12, 13 and 14, the fuse element 15 and the relay terminal 32 are respectively made of separate busbar materials.

The semiconductor relay 11C is a bare chip such as a FET of a P-channel MOS type, and includes a drain electrode D (unillustrated), a source electrode S (unillustrated) and a gate electrode G (unillustrated). The drain electrode D is arranged on the back surface of the semiconductor relay 11C, while the source electrode S and the gate electrode G are arranged on respective portions of the front surface thereof. Thus, a relay circuit is formed to switch between a conducting state and a non-conducting state of a connection between the drain electrode and the source electrode according to a control signal inputted to the gate electrode. The drain electrode is electrically connected to the second connecting terminal 13 by soldering the semiconductor relay 11C to the second connecting terminal 13. The source electrode is electrically connected to the relay terminal 32 through a bonding wire 17i. The gate electrode is electrically connected to an output electrode (unillustrated) of the semiconductor relay driving element 30B through a bonding wire 17j.

The semiconductor relay driving element 30B is a bare chip, and includes a source-side electrode (unillustrated), an input electrode (unillustrated) and an output electrode (unillustrated), the three of which are arranged on respective portions on the front surface of the semiconductor relay driving element 30B. The source-side electrode is electrically connected to the relay terminal 32 through a bonding wire 17k. The input electrode is connected to the third connecting terminal 14 through a bonding wire 17l.

Like the foregoing fourth embodiment, an integral structure is formed by sealing, with a mold resign sealing portion 40, the relay terminal 32, the semiconductor relay 11C, the semiconductor relay driving element 30B, and the first to third connecting terminals 12, 13 and 14 excluding respective portions to be connected to corresponding terminals. The first connecting terminal 12 and fuse connecting portions 12a and 32a of the relay terminal 32 are exposed to the outside without being sealed with the mold resin sealing portion 40.

By soldering or the like, both ends of the fuse element 15B are respectively connected to the two fuse connecting portions 12a and 32a exposed from the mold resin sealing portion 40. The mold resin sealing portion 40 and the fuse element 15B are housed in a case 41. Thereby, the fuse 10E is formed as an integral unit as a whole.

As similar to the fourth embodiment, the fifth embodiment also achieves weight reduction of the electrical junction box 1, manufacturing-cost reduction thereof, and the like. Since a relay circuit, which is a heat source, does not need to be mounted on the board inside the electrical junction box 1, the board and the like can be made without use of a high-heat radiation material or a high-heat resistant material. This also reduces the costs. In addition, when the semiconductor relay 11C breaks down, the necessary repair work is only to exchange the fuse 10E. Thus, the maintainability is improved.

In the fifth embodiment, as similar to the fourth embodiment, the first to third connecting terminals 12, 13 and 14, the semiconductor relay 11C and the semiconductor relay driving element 30B are sealed with the mold resin sealing portion 40 to form the integral structure. Then, the mold resin sealing portion 40 and the fuse element 15B are housed in the case 41 to form a single unit as a whole. Accordingly, the semiconductor relay 11C and the semiconductor relay driving element 30B are completely separated from the outside by the mold resign sealing portion 40. This configuration surely prevents water, dust or the like from adversely influencing the fuse 10E. In contrast, the fuse element 15B itself is not sealed with the mold resin sealing portion 40. Thus, the fuse element 15B is surely blown out when receiving an excessive electric current.

The fifth embodiment produces the following advantage. In the case where the semiconductor relay 11C is a MOS-type FET, the breakdown voltage between the gate and source electrodes is lower than the breakdown voltage between the drain and source electrodes. For this reason, if a surge current such as static electricity is applied to the gate electrode of the semiconductor relay 11C, the semiconductor relay 11C is highly likely to break down. However, even though a surge current such as static electricity occurs due to a touch on the third connecting terminal 14 given by a person or the like, or due to another similar cause, the configuration of the fifth embodiment can surely prevent the semiconductor relay 11C from breaking down. This is because a Zener diode of the semiconductor relay driving element 30B keeps the voltage between the gate and source electrodes constant to prevent such surge current to directly flow into the gate electrode of the semiconductor relay 11C. Accordingly, the fuse 10E of the fifth embodiment has the advantage that the circuit of the semiconductor relay 11C does not have to be protected.

In the fourth and fifth embodiments, the semiconductor relays 11A and 11C are each directly mounted on the second connecting terminal 13. However, a semiconductor arranging electrode may be provided to mount each of the semiconductor relays 11A and 11C like the second embodiment, or the semiconductor relays 11A and 11C may be each mounted on the relay terminal 32.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A fuse comprising:
   a first connecting terminal to be electrically connected to a side of a power source;
   a second connecting terminal to be electrically connected to a side of a load;
   a third connecting terminal to be electrically connected to a side of a relay control circuit;
   a fuse element having one end directly physically connected to the first connecting terminal;
   a semiconductor relay including a relay circuit configured to switch between a conducting state and a non-conducting state of a connection between a drain electrode and a source electrode of the semiconductor relay according to a control signal inputted to a gate electrode of the semiconductor relay, the drain electrode being electrically connected to the other end of the fuse element and the source electrode being electrically connected to the second connecting terminal, and the gate electrode being electrically connected to the third connecting terminal; and
   a semiconductor relay driving element configured to output a driving signal to the gate electrode of the semiconductor relay,
   wherein the semiconductor relay is directly physically mounted on the second connecting terminal,
   wherein the semiconductor relay driving element is electrically connected to and directly physically mounted on the second connecting terminal and electrically connected to the gate
   electrode of the semiconductor relay and the third connecting terminal,
   wherein the first, second and third connecting terminals, the semiconductor relay, and the semiconductor relay driving element are sealed with a mold resin sealing portion to form a first single unit,
   wherein the fuse element is connected to fuse connecting portions exposed from the mold resin sealing portion of the first single unit, and
   wherein the mold resin sealing portion of the first single unit, the fuse element, and the fuse connecting portions are housed in a case to form a second single unit as a whole.

2. The fuse according to claim 1, wherein
the semiconductor relay has one surface being formed as any one of the drain electrode, the source electrode and the gate electrode.

3. The fuse according to claim 1, wherein the first connecting terminal and the fuse element are integrally formed.

4. The fuse according to claim 1, wherein
the fuse element is made of a low melting metal and formed in a wire shape, and
the wire-shaped fuse element is interposed between the first connecting terminal and the drain electrode of the semiconductor relay by wire bonding.

* * * * *